United States Patent [19]

Kolling et al.

[11] Patent Number: 5,519,583
[45] Date of Patent: May 21, 1996

[54] INTEGRATED COMMON MODE CURRENT DECOUPLER FOR I/O CABLES

[75] Inventors: Craig H. Kolling, Louisville; Thurman J. Ritenour, Boulder; Michael S. Wagner, Longmont, all of Colo.

[73] Assignee: Storage Technology Corporation, Louisville, Colo.

[21] Appl. No.: 175,106

[22] Filed: Dec. 29, 1993

[51] Int. Cl.⁶ .............................. H01R 23/68; H05K 9/00
[52] U.S. Cl. ..................... 361/788; 361/796; 361/799; 361/800; 361/803; 439/61; 439/62; 439/620
[58] Field of Search .................................. 361/784, 785, 361/786, 788, 751, 756, 757, 799, 800, 803, 818; 439/61, 62, 620

[56] References Cited

U.S. PATENT DOCUMENTS

| | | | |
|---|---|---|---|
| 3,389,306 | 6/1968 | Schmidt et al. | 361/799 |
| 4,600,256 | 7/1986 | Anttila | 439/620 |
| 4,631,641 | 12/1986 | Brombal et al. | 361/800 |
| 4,697,858 | 10/1987 | Balakrishnan | 439/61 |
| 5,105,340 | 4/1992 | Lawrence | 361/799 |
| 5,128,832 | 7/1992 | Lawrence | 361/799 |
| 5,145,413 | 9/1992 | Okamoto et al. | 439/620 |
| 5,246,389 | 9/1993 | Briones | 439/620 |
| 5,360,353 | 11/1994 | Kinoshita | 439/620 |

FOREIGN PATENT DOCUMENTS

| | | | |
|---|---|---|---|
| 2602920 | 2/1988 | France | 439/620 |
| 3211758 | 10/1983 | Germany | 361/818 |

OTHER PUBLICATIONS

IBM Technical Disclosure Bulletin "Incorporation of decoupling capacitors into connector" vol. 20 No. 11A Apr. 1978 p. 4338.

Primary Examiner—Donald A. Sparks
Attorney, Agent, or Firm—Sterne, Kessler, Goldstein & Fox

[57] ABSTRACT

An integrated decoupler for returning common mode current to a source located in a card cage, which in turn is located in a data processing equipment cabinet. The integrated decoupler comprises an electrically conductive cladding layer formed on a backplane of the card cage and electrically connected to the card cage and a decoupling connector mounted directly on the cladding layer. The decoupling connector has decoupling capacitors for shunting common mode current to the cladding layer.

17 Claims, 4 Drawing Sheets

INTEGRATED COMMON MODE CURRENT DECOUPLER FOR I/O CABLES

BACKGROUND OF THE INVENTION

1. Field of the Invention

The present invention relates generally to the field of electromagnetic shielding, and more particularly, to a system and method for decoupling common mode current in data processing equipment (DPE).

2. Related Art

Common mode (CM) currents flowing along external cables, such as bus and tag cables, input/output (I/O) cables, and the like, that emerge from data processing equipment (DPE) create excessive far field electromagnetic emissions as they flow along these cables. As a condition of sale, present national and international regulations require DPE far field emissions due to CM currents to be held to relatively low levels.

A conventional method to reduce this emission mode is to return the CM currents to their source at the point of cable emergence from the equipment in question. Presently, for large DPE this method of returning the CM current is difficult. The difficulty with this conventional method is that it utilizes discrete capacitors with, for large DPE, a long meandering return path to the CM current source. An example of the conventional method to return CM current to its source is shown in FIG. 1.

FIG. 1 shows a large DPE system 100 comprising a DPE cabinet 102 for internally supporting one or more equipment housings or card cages 104. Bus and tag cables 106,108, input/output (I/O) cables 110, and the like, carry high frequency data signals, control signals, power supply lines, and the like, between the card cage 104 and the cabinet 102 via card cage connectors 112, 114 and 116 and to cabinet connectors 118, 120 and 122. From connectors 118, 120 and 122 external cables 128, 130 and 132 carry high frequency data signals, control signals, power supply lines and the like out of the cabinet 102. The conventional method returns the CM currents to their source using discrete capacitors (shown schematically at) 124 through a meandering return path 126. The meandering path 126 passes through a conductive frame (shown in cut-away view) of the cabinet 102 to the card cage 104.

The length of the meandering path 126 causes serious loss of efficiency due to low frequency (less than 30 mega Hertz (MHz)) series resonance and high inductive reactance above series resonance. The high reactance impedes the flow of CM current, thus preventing the CM current from being efficiently returned to card cage 104 and allowing it to travel onto and along external cables 128, 130 and 132.

A section of a conventional connector having a discrete decoupling capacitor is shown in FIG. 2. Within the conventional connector is a printed wire board (PWB) 202 having hole(s) 204 to receive press fit contact(s) (also called pins; not shown). A decoupling capacitor 206 is conventionally used to shunt high frequencies to ground. The decoupling capacitor 206 is electrically connected to conductive (etched copper) traces 208 to the inside of the connector housing 210 by a compliant fit with a connector housing extension 212. By electrically connecting the connector housing 210 in a conventional manner to the cabinet 102 of FIG. 1, CM currents are shunted in the conventional manner by a circuitous, meandering return path 126 back to their source in card cage 104. Because the return path is highly inductive only small CM currents can be returned to their source.

What is desired is a system and method for efficiently returning CM currents to their source so as to lower far field electromagnetic emissions.

SUMMARY OF THE INVENTION

The present invention is directed to an integrated decoupler for returning common mode current to its source. A data processing equipment (DPE) cabinet houses one or more card cages having dam processing equipment located therein. An electrically conductive cladding layer is formed on a backplane of each card cage and is electrically connected to its respective card cage. Decoupling connectors are mounted directly on the chassis cladding layer. The decoupling connectors have decoupling capacitors for shunting common mode current to the chassis cladding layer.

The decoupling connector comprises a printed wire board for supporting the decoupling capacitors, press fit contacts press fit into the printed wire board, a connector housing for housing the press fit contacts, and a ground finger strip located between the printed wire board and the chassis cladding layer. The ground finger strip is mounted directly on the chassis cladding. The decoupling capacitors are therefore connected by a very short return path to the chassis cladding layer.

The ground finger strip electrically couples the decoupling capacitors to the chassis cladding layer so that common mode currents are quickly returned to their source via the chassis cladding layer. This prevents common mode currents from flowing out of the DPE cabinet via external cables and thus prevents far field emissions.

The foregoing and other features and advantages of the present invention will be apparent from the following more particular description of the preferred embodiments of the invention, as illustrated in the accompanying figures.

BRIEF DESCRIPTION OF THE FIGURES

The invention will be better understood if reference is made to the accompanying drawings in which.

DETAILED DESCRIPTION OF THE PREFERRED EMBODIMENT

The preferred embodiment of the invention is discussed in detail below. While specific steps, configurations and arrangements are discussed, it should be understood that this is done for illustrative purposes only. A person skilled in the relevant art will recognize that other steps, configurations and arrangements can be used without departing from the spirit and scope of the invention.

The preferred embodiment of the invention is now described with reference to the figures where like reference numbers indicate identical or functionally similar elements. Also in the figures, the left most digit of each reference number corresponds to the figure in which the reference number is first used.

Figure 1:
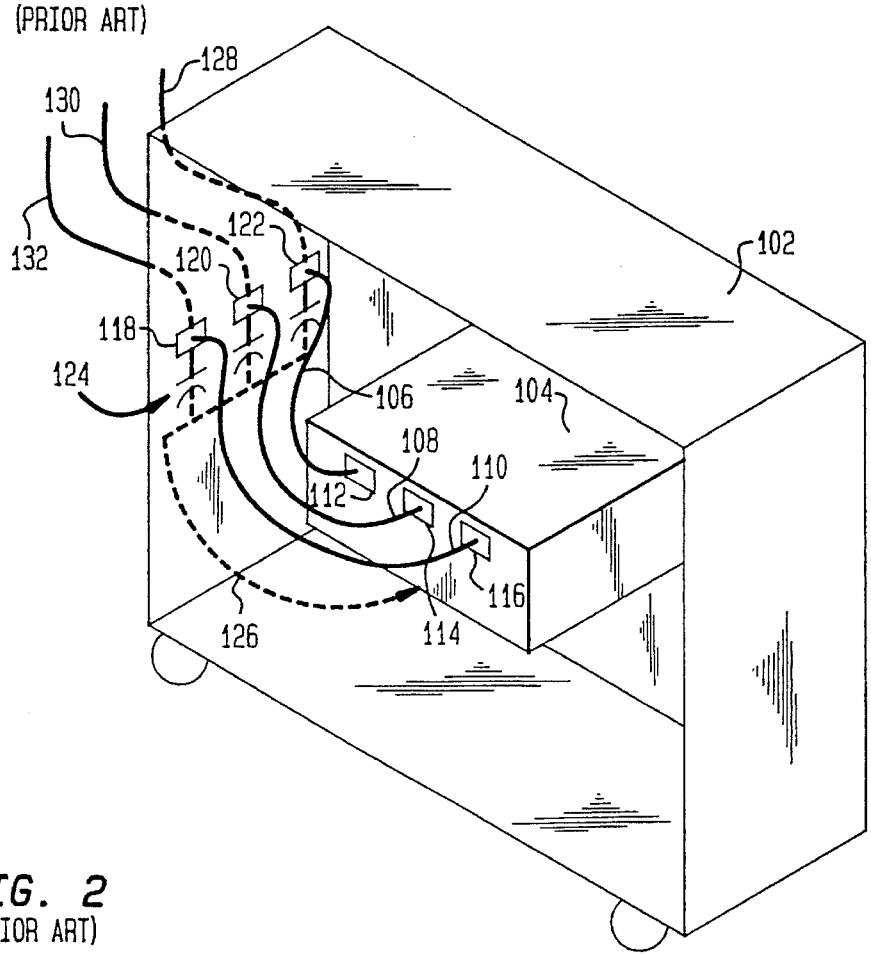
FIG. 1 shows a large DPE system 100 comprising a DPE cabinet 102 for supporting a card cage 104.
Figure 2:
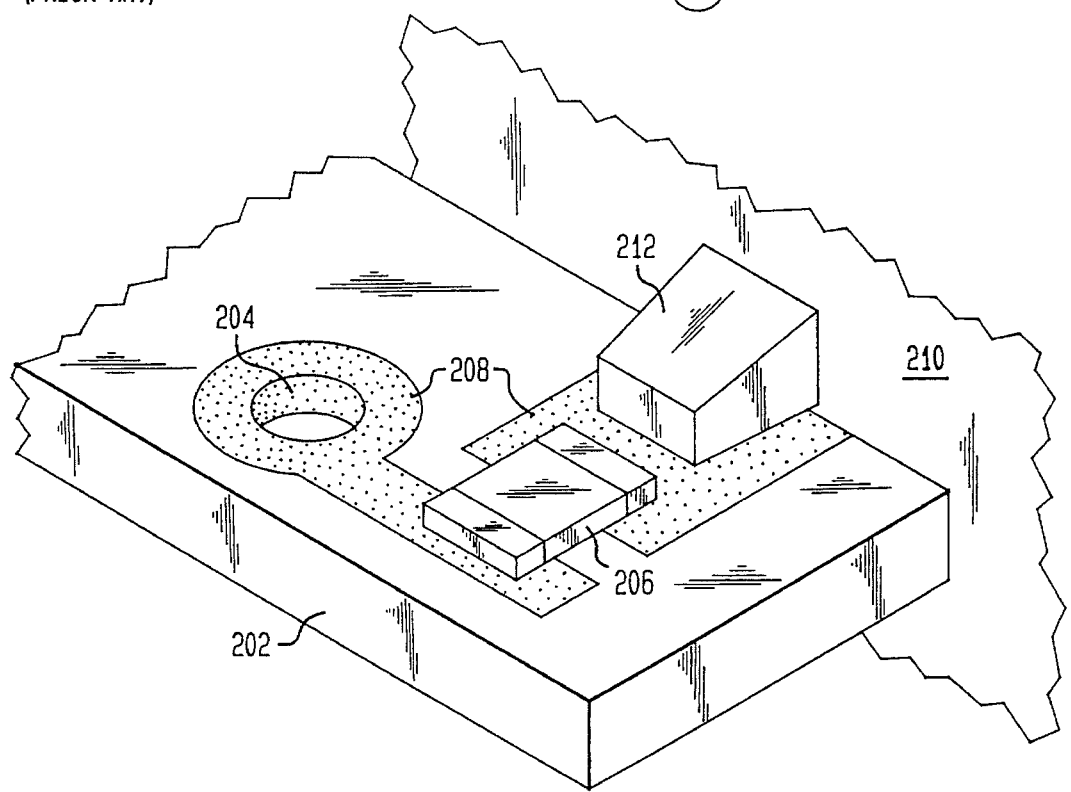
FIG. 2 shows a section of a conventional connector having a discrete decoupling capacitor.

The inventors have discovered that decoupling can be accomplished internally next to or adjacent to the source of the noise, rather than decoupling the cables 106, 108 and 110 at the cabinet 102. According to the present invention, noise emerging from the card cage is returned to the source by a much shorter return path having very low inductance. Because of the short return path and the low inductance of that return path, larger common-mode (CM) currents can be shunted more efficiently to ground. The total consequence, according to the present invention, is a significant reduction of between 10 and 20 decibels (dB), which is a factor of 3 to 10, compared to conventional decoupling as shown in FIG. 1, for example.

The present invention comprises a chassis cladding (not used for normal signal returns) on the backplane of the card cage and connectors having decoupling capacitors electrically coupled to the chassis cladding by a very short path. The chassis cladding covers the entire backplane of the card cage, which is the sixth wall of the card cage itself. The chassis cladding is electrically coupled around the entire perimeter of the sixth wall (backplane) so as to continuously ground the chassis cladding to the four adjacent walls of the card cage.

According to the present invention, common mode currents are quickly shunted to the chassis cladding by using a ground finger strip within the decoupling connectors. The ground finger strip is mounted directly on the chassis cladding. The decoupling capacitors of the connectors are therefore connected by a very short return path to the chassis cladding.

Figure 3:
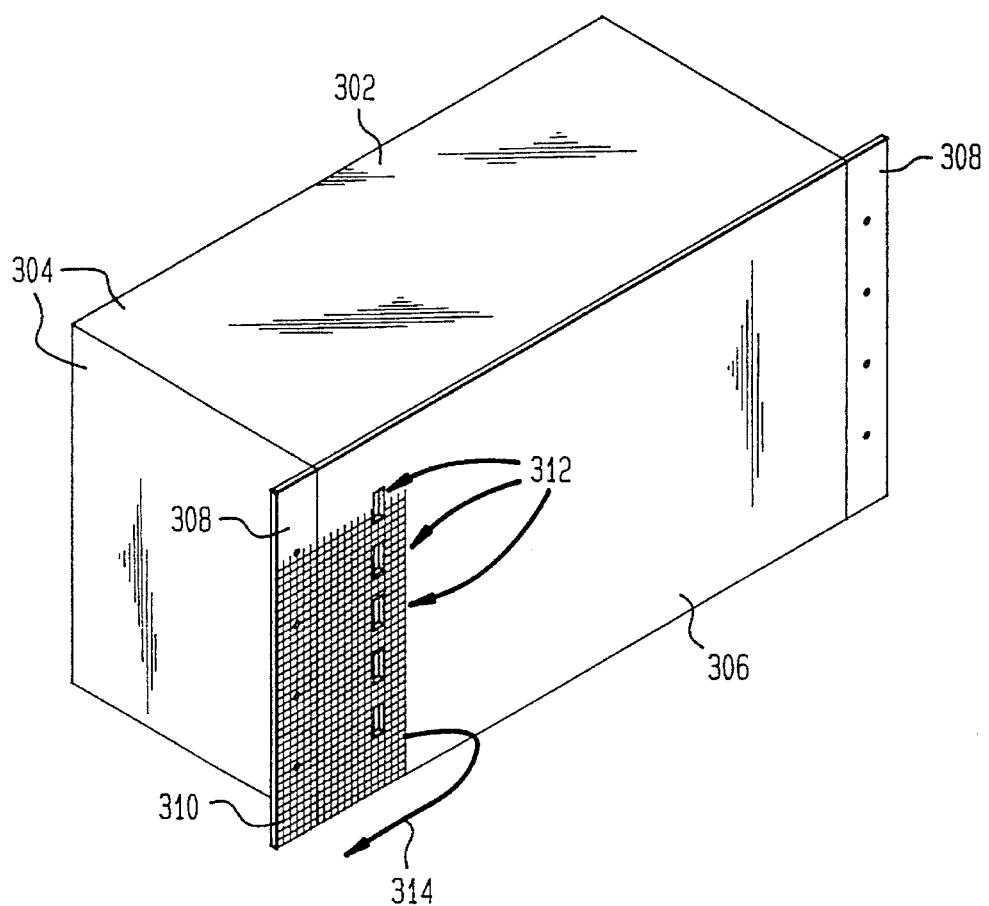
FIG. 3 shows a card cage 302 according to the present invention.
Figure 6:
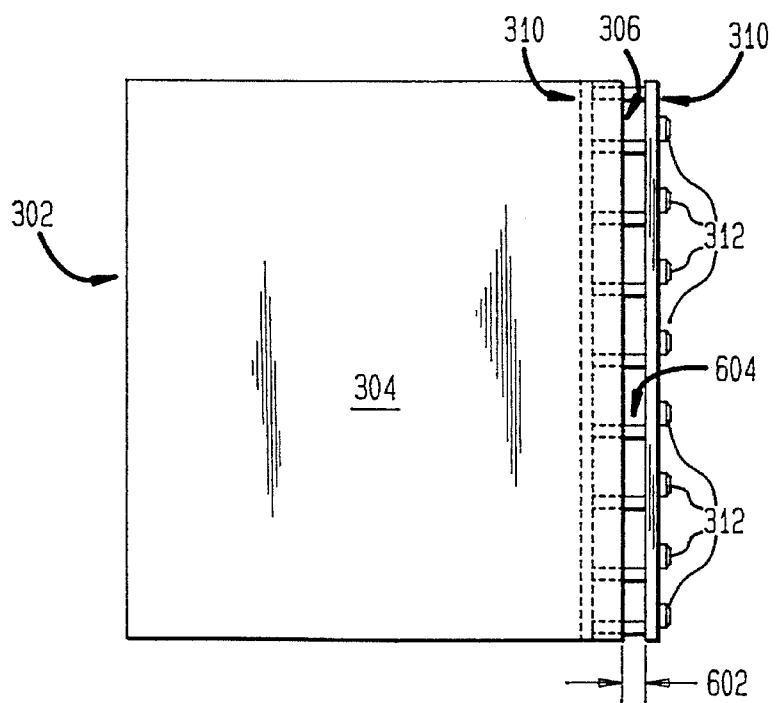
FIG. 6 shows a side view of card cage 302 according to the present invention.

FIGS. 3 and 6 show a card cage 302 according to the present invention. Card cage 302 comprises five total card cage walls 304. The sixth wall of the card cage 302 is comprised of a backplane 306 (i.e., a motherboard for supporting a plurality of daughter boards within the card cage 302). The card cage 302 also comprises mounting flanges 308 for securing the card cage 302 within a larger cabinet (not shown), such as cabinet 102 of FIG. 1. The mounting flanges 308 provide connectivity of the card cage 302 to ensure that it is firmly and electrically attached to the frame (not shown) of the larger cabinet (not shown).

A chassis cladding layer (hereafter called chassis cladding) 310 is provided on the backplane 306. The chassis cladding 310 and backplane 306 support a plurality of decoupling connectors 312. Casings for the decoupling connectors 312 are not shown, but are used to receive the external connectors. The connector casings are configured in a known manner to receive cables and matching connectors, which are also not shown in FIG. 3.

According to the present invention, the chassis cladding 310 and decoupling connectors 312 provide a very short current return path 314 for decoupling CM currents. Only a section of the chassis cladding 310 is shown covering the backplane 306 in FIG. 3. However, the chassis cladding 310 extends across the entire backplane 306 and is electrically wrapped around and/or connected to the adjacent four walls 304 around the entire perimeter of the backplane 306.

The chassis cladding 310 may be formed by layering an insulator, such as glass epoxy, over the back of backplane 306. The glass epoxy can then be coated with a solid layer of copper.

In a preferred embodiment of the present invention, the chassis cladding 310 is formed of a copper mesh. According to conventional copper cladding techniques, the mesh provides exposure of the glass epoxy such that process solder mask properly adheres to the copper. In the preferred embodiment, the chassis cladding mesh is formed of a grid of copper strips 11 thousandths-of-an-inch (mils) wide on 25 mils centers and having a thickness of one mil. A minimum copper thickness and width must be used to ensure adequate transfer impedance of the chassis cladding.

The glass epoxy, or the like, which is used to electrically isolate the chassis cladding 310 from the microstrips (also called logic traces) on the backplane 306, must be sufficiently thick so that the chassis cladding 310 does not change the characteristic impedance of the backplane 306. In other words, sufficient space must be left between the closest logic traces on the backplane 306 and the tin copper of the chassis cladding 310. This is done so that the chassis cladding 310 does not become electromagnetically coupled to the backplane 306 so as to interfere with proper decoupling of CM currents. The inventors have determined that the chassis cladding 310 should have a separation 602 from the backplane 306 of approximately 25 to 45 mils (preferably 35 mils), depending on the characteristic impedance of the microstrips on the backplane 306. Chassis cladding layer 310 covers the entire backplane 306 (as shown in FIG. 6). Chassis cladding layer 310 is electrically coupled 604 around the entire perimeter of backplane 306 so as to continuously ground chassis cladding layer 310 to the four adjacent walls 304.

Figure 4:
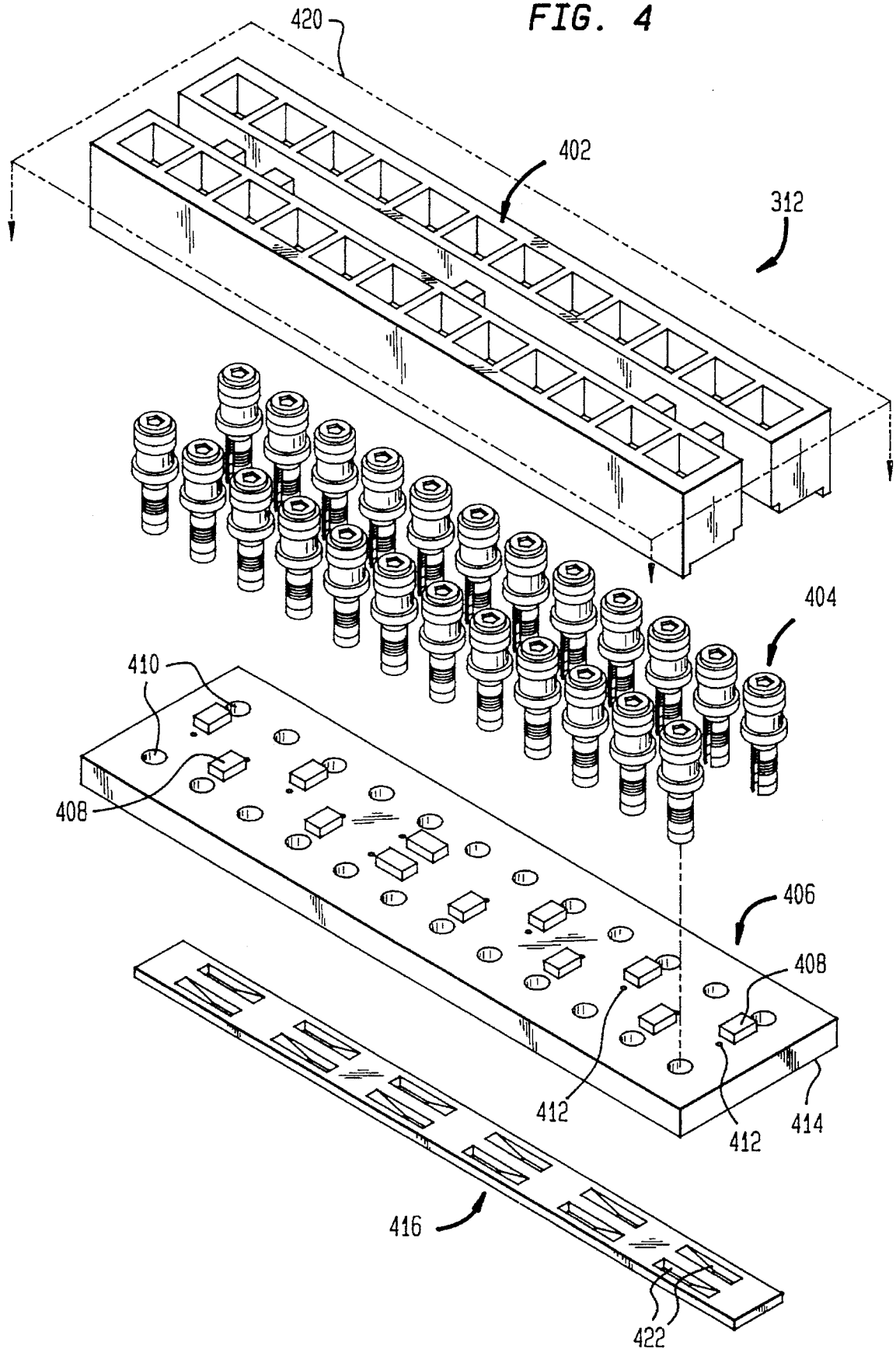
FIG. 4 shows a representative diagram of the components comprising decoupling connectors 312, according to the present invention.

FIG. 4 shows a representative diagram of the components comprising decoupling connectors 312. Each decoupling connector 312 comprises a connector housing 402, pressfit contacts 404 (shown as female gender), printed wireboard (PWB) 406 having decoupling capacitors 408 and a ground finger strip 416.

As noted above, each decoupling connector 312 is secured to the chassis cladding 310 and backplane 306 via a connector casing generally shown at 420 in FIG. 4. The connector casing 420 can mechanically connect one or more decoupling connectors 312. The details of the connector casing 420 are beyond the scope of the present invention and will therefore not be described in detail.

The pressfit contacts 404 press fit into the PWB 406 at holes 410. The pressfit contacts 404 are used to partially secure connector housing 402 together with the connector casing. The pressfit contacts 404 receive complementary pins of a cable connector (not shown) in a known manner. The gender of the pressfit contacts 404 is application-specific.

In the embodiment of decoupling connector 312 shown in FIG. 4, each signal has one active contact and one return contact. For this application, each pressfit contact 404 corresponding to the return signal is decoupled to the chassis cladding 310 using a decoupling capacitor 308 (thus only 12 decoupling capacitors 308 are shown). One electrode of each decoupling capacitor 408 is electrically connected to the active pressfit contact 404 by a trace (not shown) on the PWB 414. The other electrode of each decoupling capacitor 408 is shunted to the ground figure strip 416 by a via 412. Vias 412 provide electrical contact through the PWB 406 to a back side 414, where electrical contact is made to ground figure strip 416 by further traces (not shown) on the bottom 414 of PWB 406. The ground figure strip 416 connects the decoupling capacitors directly to chassis cladding 310.

In the preferred embodiment of the present invention, the PWB 406 is approximately 50 mils thick and has top and bottom etched copper traces formed in a conventional manner. The decoupling capacitors 408 comprise commercially available 0.001 micro-farad (μf) multi-layer ceramic surface mount capacitors.

The ground finger strip 416 is formed by stamping a thin film of beryllium copper. The stamping process generates sufficiently sharp fingers 422 so as to cut into and through any oxidation coating on the tin copper chassis cladding 310 for shunting of CM currents.

Figure 5:
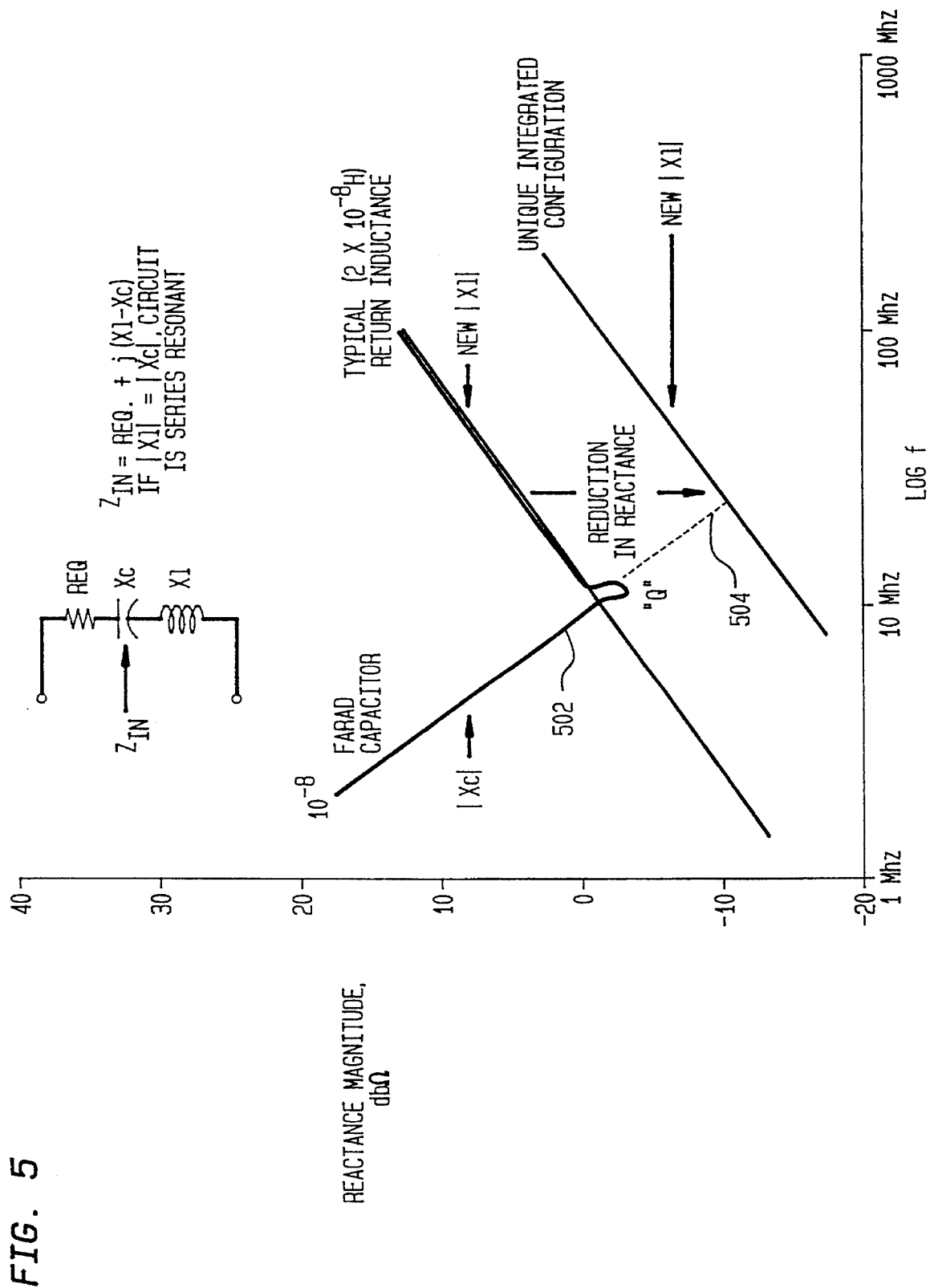
FIG. 5 shows a plot of reactance magnitude versus frequency.

FIG. 5 shows a plot of reactance magnitude (in units of dB) plotted on the y-axis versus frequency (in units of megahertz (MHz)) plotted on the x-axis. Curve 502 represents the reactance magnitude of a long return path according to conventional decoupling techniques. A curve 504 shows a reduced reactance achieved according to the decoupling technique of the present invention.

The reduction in reactance corresponds to a reduction in voltage drop, thus allowing additional CM current to be shunted according to the present invention. The shunting of more CM current achieves greater reduction of near field emissions. A ternary benefit to the reduction of CM currents is that overall system noise is reduced remarkably.

The present invention can be implemented in all electronic processing equipment using I/O cables. The advantage according to the present invention is that a reduction of up to an order of magnitude of external fields that will allow easier compliance to Federal and International standards. In addition, the present invention will reduce equipments susceptibility to radiated fields and electrostatic discharge by the same amount.

While various embodiments of the present invention have been described above, it should be understood that they have been presented by way of example, and not limitation. It will be apparent to persons skilled in the relevant art that various changes in form and detail may be made therein without departing from the spirit and scope of the invention. The present invention should not be limited by any of the above-described exemplary embodiments, but should be defined only in accordance with the following claims and their equivalents. All cited patent documents and publications in the above description are incorporated herein by reference.

What is claimed is:

1. An integrated decoupler for returning common mode current to a source located in a card cage, comprising:

an electrically conductive cladding layer electrically isolated from an outer surface of a backplane of the card cage and electrically connected to the card cage; and a decoupling connector mounted directly on said cladding layer, said decoupling connector having decoupling capacitors for shunting common mode current to said cladding layer.

2. The decoupler of claim 1, wherein the backplane is attached to four walls of the card cage thereby defining a perimeter of the backplane and said cladding layer covers the entire backplane and is electrically connected to the chassis around the entire perimeter.

3. The decoupler of claim 2, wherein said cladding layer is a contiguous layer.

4. The decoupler of claim 2, wherein said cladding layer is a mesh.

5. The decoupler of claim 2, further comprising a plurality of decoupling connectors mounted directly on said cladding layer.

6. The decoupler of claim 2, wherein said cladding layer is located between 25–45 mils away from the backplane.

7. The decoupler of claim 6, wherein said cladding layer is located 35 mils away from the backplane.

8. The decoupler of claim 2, wherein said decoupling connector comprises:

a printed wire board for supporting said decoupling capacitors;

a plurality of press fit contacts press fit into said printed wire board;

a connector housing for housing said plurality of press fit contacts; and a ground finger strip located between said printed wire board and said cladding layer, wherein said ground finger strip electrically couples said decoupling capacitors to said cladding layer for conducting the common mode current.

9. The decoupler of claim 1, wherein said electrically conductive cladding layer is formed on an inner surface of the backplane of the card cage.

10. An integrated decoupler for returning common mode current to a source, comprising:

a data processing equipment cabinet;

a card cage located in said data processing equipment cabinet;

an electrically conductive cladding layer electrically isolated from an outer surface of a backplane of said card cage and electrically connected to said card cage; and a decoupling connector mounted directly on said cladding layer, said decoupling connector having decoupling capacitors for shunting common mode current to said cladding layer, wherein said decoupling connector comprises:

a printed wire board for supporting said decoupling capacitor;

a plurality of press fit contacts press fit into said printed wire board;

a connector housing for housing said plurality of press fit contacts; and a ground finger strip located between said printed wire board and said cladding layer, wherein said ground finger strip electrically couples said decoupling capacitors to said cladding layer for conducting the common mode current.

11. The decoupler of claim 10, wherein the backplane is attached to four walls of the card cage thereby defining a perimeter of the backplane and said cladding layer covers the entire backplane and is electrically connected to the chassis around the entire perimeter.

12. The decoupler of claim 11, wherein said cladding layer is a contiguous layer.

13. The decoupler of claim 11, wherein said cladding layer is a mesh.

14. The decoupler of claim 11, further comprising a plurality of decoupling connectors mounted directly on said cladding layer.

15. The decoupler of claim 14, wherein said cladding layer is located between 25–45 mils away from the backplane.

16. The decoupler of claim 14, wherein said cladding layer is located 35 mils away from the backplane.

17. The decoupler of claim 10, wherein said electrically conductive cladding layer is formed on an inner surface of the backplane of the card cage.

* * * * *